(12) United States Patent
Darmawikarta et al.

(10) Patent No.: US 10,026,691 B2
(45) Date of Patent: Jul. 17, 2018

(54) PACKAGE SUBSTRATE HAVING NONCIRCULAR INTERCONNECTS

(71) Applicant: Intel Corporation, Santa Clara, CA (US)

(72) Inventors: Kristof Kuwawi Darmawikarta, Chandler, AZ (US); Kyu Oh Lee, Chandler, AZ (US); Daniel Nicholas Sobieski, Heverlee (BE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/180,994

(22) Filed: Jun. 13, 2016

(65) Prior Publication Data

US 2017/0358528 A1 Dec. 14, 2017

(51) Int. Cl.
| | |
|---|---|
| *H01L 23/528* | (2006.01) |
| *H01L 23/00* | (2006.01) |
| *H01L 21/768* | (2006.01) |
| *H01L 23/522* | (2006.01) |
| *H01L 21/033* | (2006.01) |

(52) U.S. Cl.
CPC ........ *H01L 23/528* (2013.01); *H01L 21/0337* (2013.01); *H01L 21/7685* (2013.01); *H01L 21/76865* (2013.01); *H01L 21/76883* (2013.01); *H01L 23/5226* (2013.01); *H01L 24/09* (2013.01); *H01L 24/17* (2013.01); *H01L 2224/0401* (2013.01); *H01L 2224/04042* (2013.01); *H01L 2224/48091* (2013.01)

(58) Field of Classification Search
CPC ... H01L 2224/0401; H01L 2224/48227; H01L 23/481; H05K 1/112; H05K 1/113; H05K 2201/09854; H05K 2201/09218

USPC ............... 257/773, 774, E21.577, E23.011; 438/637, 612, 622
See application file for complete search history.

(56) References Cited

U.S. PATENT DOCUMENTS

| | | | |
|---|---|---|---|
| 6,891,272 B1 | 5/2005 | Fjelstad | |
| 2010/0212947 A1* | 8/2010 | Yamanaka | H01L 23/49827 174/260 |
| 2011/0248399 A1 | 10/2011 | Pendse | |
| 2014/0048953 A1* | 2/2014 | Pratt | G03F 9/708 257/774 |

(Continued)

FOREIGN PATENT DOCUMENTS

KR 10-2016-0019739 2/2016

OTHER PUBLICATIONS

International Search Report and Written Opinion for PCT/US2017/028433, dated Jul. 28, 2017, 14 pages.

*Primary Examiner* — Jonathan Han
(74) *Attorney, Agent, or Firm* — Schwabe, Williamson & Wyatt, P.C.

(57) ABSTRACT

Package substrates including conductive interconnects having noncircular cross-sections, and integrated circuit packages incorporating such package substrates, are described. In an example, a conductive pillar having a noncircular pillar cross-section is electrically connected to an escape line routing layer. The escape line routing layer may include several series of conductive pads having noncircular pad cross-sections. Accordingly, conductive traces, e.g., strip line escapes and microstrip escapes, may be routed between the series of conductive pads in a single escape line routing layer.

13 Claims, 10 Drawing Sheets

DETAIL A

(56) References Cited

U.S. PATENT DOCUMENTS

| | | | |
|---|---|---|---|
| 2014/0159203 A1* | 6/2014 | Liu | H01L 24/81 257/536 |
| 2014/0217605 A1 | 8/2014 | Linet et al. | |
| 2014/0327135 A1 | 11/2014 | Lee et al. | |
| 2015/0035161 A1* | 2/2015 | Miao | H01L 23/5283 257/774 |
| 2015/0041859 A1* | 2/2015 | Otremba | H01L 23/49503 257/194 |

* cited by examiner

DETAIL A

B - B

US 10,026,691 B2

PACKAGE SUBSTRATE HAVING NONCIRCULAR INTERCONNECTS

TECHNICAL FIELD

Embodiments described herein generally relate to the field of integrated circuit packages and, in particular, package substrates having escape line routing layers electrically connected to vertical interconnects.

BACKGROUND

An integrated circuit package is used for protecting an integrated circuit chip or die, and also to provide the chip or die with a physical and electrical interface to external circuitry. The integrated circuit package may include the die mounted on a package substrate having escape line routing layers, e.g., strip line escape layers and microstrip escape layers. More particularly, the die may be electrically connected to external circuitry through the escape line routing layers and vertical interconnects of the package substrate. For example, the escape line routing layers may be electrically connected to other conductive layers of the package substrate by microvias.

DESCRIPTION OF EMBODIMENTS

Package substrates including conductive pillars having noncircular cross-sections when viewed from a top view, and integrated circuit packages incorporating such package substrates, are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing package substrates of integrated circuit packages may include several conductive layers separated by intervening dielectric layer(s), and vertical electrical interconnects may transfer electrical signals through the dielectric layer(s) between the conductive layers. Such interconnects may be microvias, which are typically formed by laser drilling holes in laminated dielectric build up materials, and then filling the holes with copper. The laser-drilled holes, and thus the microvias, include circular cross-sections because the laser beam used to drill the holes has a circular spot size. Capture pads are typically patterned over the ends of the microvias using photolithography. Misalignment between the microvias and the capture pads occurs, however, because there is a tolerance stack-up from the series of processes, i.e., a first photolithography operation, the laser drilling operation, and a second photolithography operation.

Figure 1:
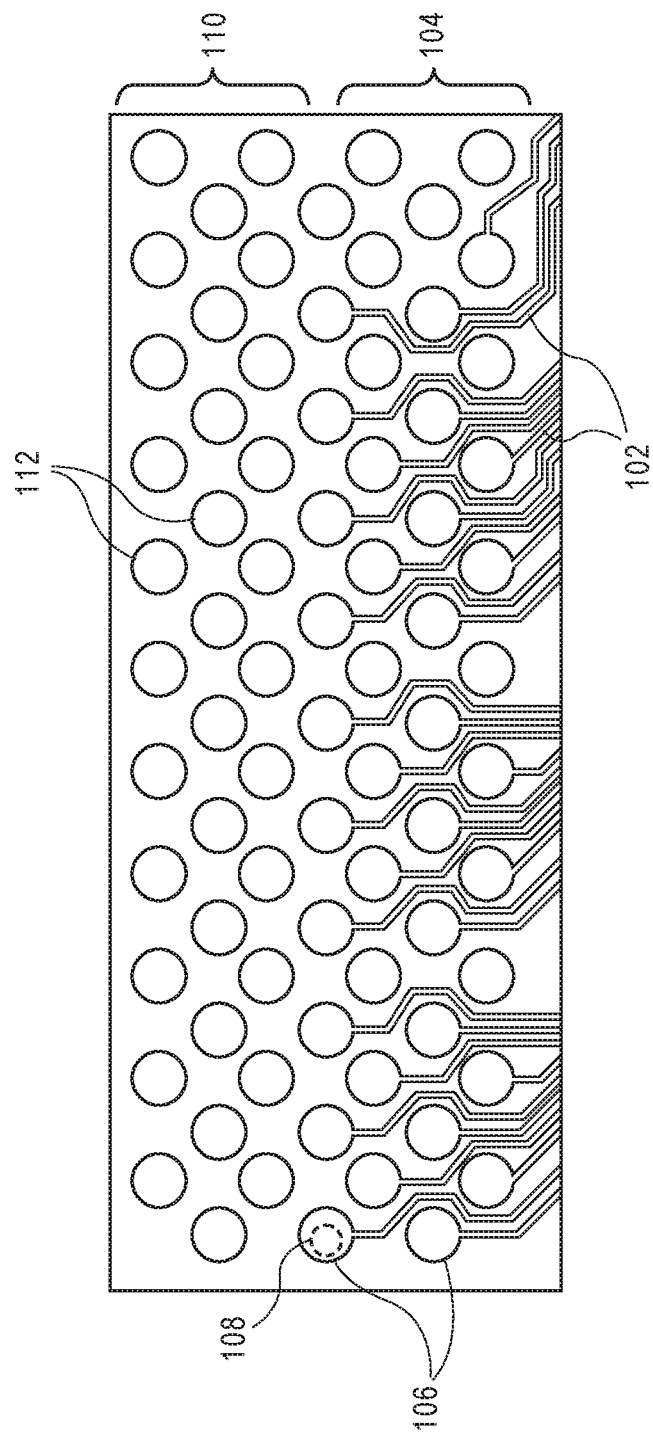
FIG. 1 is a sectional view of an escape line routing layer of a package substrate including microvias and capture pads having circular cross-sections.

Referring to FIG. 1, a sectional view of an escape line routing layer of a package substrate including microvias and capture pads having circular cross-sections is illustrated. The sectional view is through the package substrate along a plane at a vertical location having microstrip traces 102. More particularly, microstrip escape routing layer 104 may include microstrip traces 102 extending laterally from microstrip capture pads 106. Capture pads 106 may be formed having circular cross-sections that are larger than necessary to compensate for misalignment with vertically connected microstrip microvias 108 (shown by hidden lines). More particularly, microstrip microvia 108 extends vertically from microstrip capture pad 106, and the circular cross-sections of these features are misaligned. Thus, to ensure that electrical contact is made between the capture pads and the microvias, the circular capture pads are oversized. For example, an alignment capability of 14 microns may require a 49 micron-diameter microvia and a 77 micron-diameter capture pad to ensure contact. Such dimensions may allow the escape line routing layer to have 9 micron-wide copper lines separated by 12 micron spaces.

Still referring to FIG. 1, the oversized capture pad dimensions may require that more substrate routing layers be used than would otherwise be necessary. For example, microstrip escape routing layer 104, which includes microstrip capture pads 106 and microstrip microvias 108 having circular conductive pads, may limit lateral spacing allotted to conductive traces. That is, the oversized capture pad dimensions may limit space between capture pads through which conductive traces may be routed, such that there is only room for microstrip traces 102, and not for strip line traces (not shown) extending laterally from corresponding strip line capture pads (not shown). Thus, strip line escape routing 110 may include strip line microvias 112 extending to a plane parallel to the plane illustrated in FIG. 1, and the parallel plane may include corresponding strip line traces and strip line capture pads. The parallel plane, however, may have limited inter-pad space available for trace routing, such that only strip line traces can be routed laterally between corresponding strip line capture pads. Thus, a package substrate including microvias having circular cross-sections may require at least two routing layers to route microstrip escape routing 104 and strip line escape routing 110.

In an aspect, a package substrate includes conductive pillars and conductive pads formed by plating and build-up lamination operations. More particularly, formation of the package substrate may not require laser drilling. The plating processes may allow the conductive pillars and pads to be aligned with accuracy better than 14 microns, and thus, smaller conductive pillars and/or conductive pads may be used. Furthermore, since the plating processes may form conductive pillars and/or conductive pads having noncircular cross-sections, capture pad size may be minimized in at least one lateral direction, and conductive traces may be routed between capture pads with a higher line density. That is, more capture pads and conductive traces can be fit into a single conductive layer, e.g., strip line escapes and microstrip escapes may be combined into a single escape line routing layer. Therefore, the package substrate may incorporate a minimum number of escape line routing layers.

Figure 2:
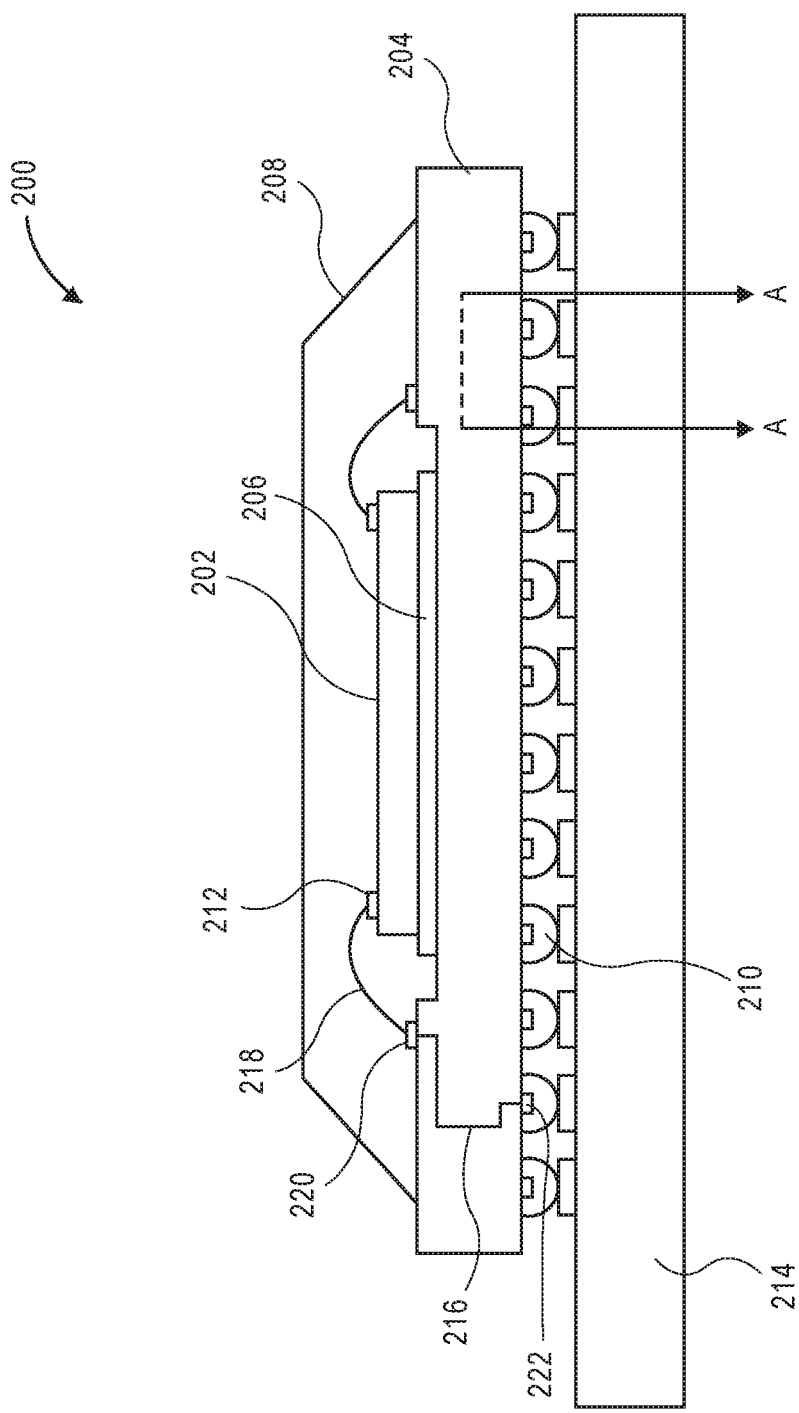
FIG. 2 is a sectional view of an integrated circuit package, in accordance with an embodiment.

Referring to FIG. 2, a sectional view of an integrated circuit package is illustrated in accordance with an embodiment. An integrated circuit package 200 may include an integrated circuit 202 mounted on a package substrate 204. For example, the integrated circuit 202 may be positioned over the package substrate 204, and an underfill material 206 may couple the integrated circuit 202 to the package substrate 204. As shown, the integrated circuit package 200 may include a wire-bonding package, however, it will be appreciated by one skilled in the art that other non-wire bonding packages may be used in accordance with the description below. For example, electrical connections between integrated circuit 202 and package substrate 204 may be made by connections extending through underfill material 206.

Package substrate 204 of integrated circuit package 200 may have a laminate structure. For example, conductive layers, e.g., layers having copper pads and traces, may be separated by dielectric layers, e.g., layers having organic epoxy-based dielectric material.

Integrated circuit package 200 may include a chip carrier, such as a ball grid array (BGA) component having a top package portion 208, e.g., a plastic cap, over package substrate 204. The chip carrier may include several electrical contacts, e.g., several solder balls 210, arranged in a ball field. More particularly, solder balls 210 may be arranged in a pattern on a bottom surface of package substrate 204.

Each solder ball 210 may be electrically connected to integrated circuit 202 to provide an electrical function. For example, solder balls 210 may be electrically connected to pins 212, e.g., a signal pin used for I/O of integrated circuit 202, or power and/or ground pins of integrated circuit 202. Furthermore, solder balls 210 may be mounted and attached to a circuit board 214, e.g., a motherboard or another printed circuit board of a computer system, to provide a physical and electrical interface between integrated circuit 202 and circuit board 214.

The electrical connection between solder balls 210 and pins 212 of integrated circuit 202 may be through an interconnect 216 and/or a lead 218. More particularly, lead 218 may electrically connect pins 212 of integrated circuit 202 to one or more bonding pads 220 mounted on a top surface of package substrate 204. Bonding pads 220 mounted on the top surface may be electrically connected to corresponding solder pads 222 on a bottom surface of package substrate 204 through interconnect 216. As described below, interconnect 216 may include horizontal segments, e.g., electrical conductors in a substrate routing layer, and vertical segments, e.g., vertical interconnects between substrate routing layers. Thus, pins 212 of integrated circuit 202 may be electrically connected to horizontal and vertical segments of interconnect 216.

Figure 3:
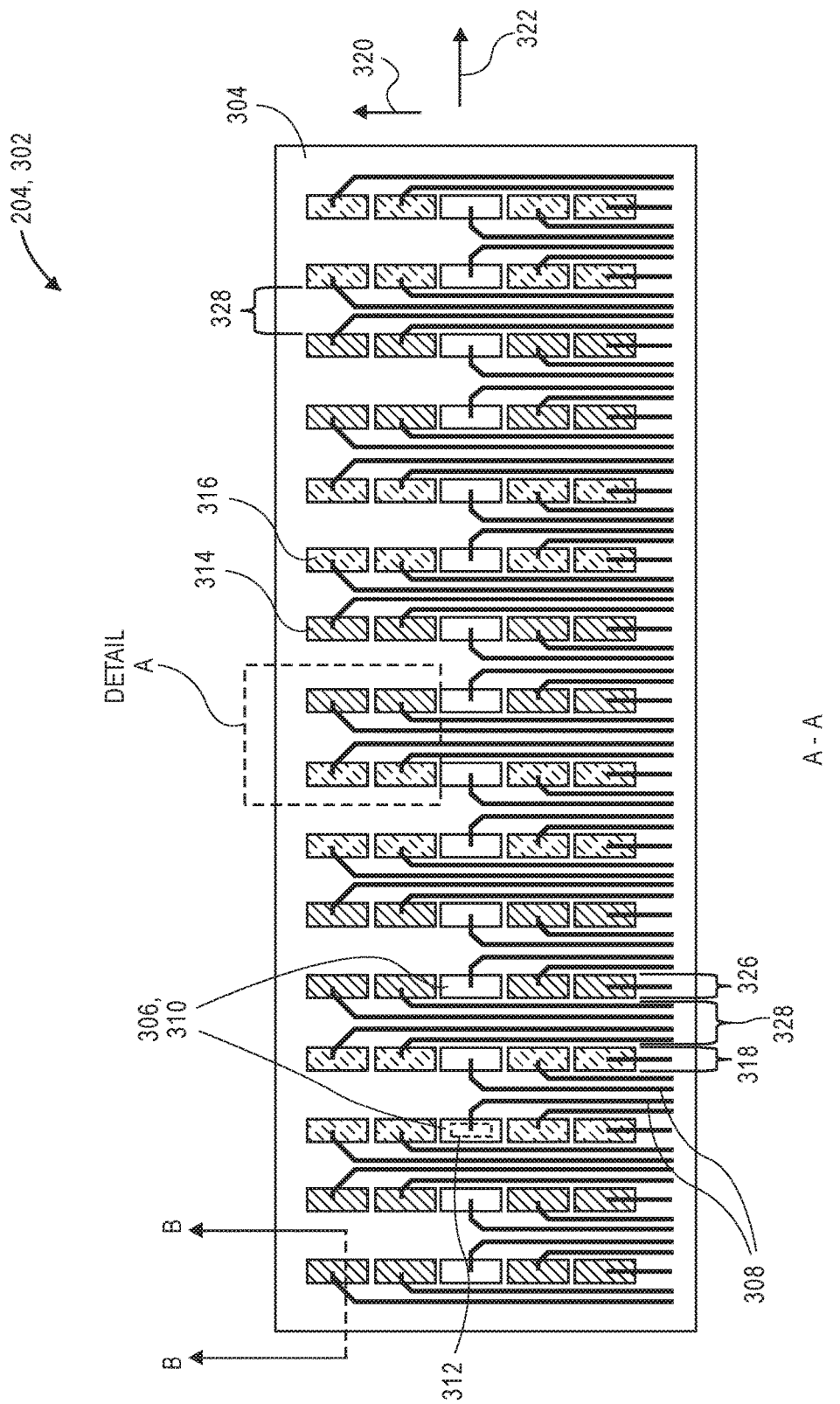
FIG. 3 is a sectional view, taken about line A-A of FIG. 2, of a package substrate having an escape line routing layer electrically connected to conductive pillars having noncircular cross-sections, in accordance with an embodiment.

Referring to FIG. 3, a sectional view, taken about line A-A of FIG. 2, of a package substrate having an escape line routing layer electrically connected to conductive pillars having noncircular cross-sections is illustrated in accordance with an embodiment. Package substrate 204 acts as a space transformer to expand escape line routing from a small area, e.g., at integrated circuit 202 or bonding pads 220, to a larger area, e.g., at solder pads 222. Escape line routing is a term used to refer to the horizontal and vertical segments of interconnect 216 extending from the small area to the larger area. As described above, escape routing incorporating microvias having circular cross-sections requires a first escape routing layer having microstrip escapes 316, and a second escape routing layer vertically offset from the first escape routing layer and having strip line escapes 314. An improvement in the alignment capability between vertical interconnects and capture pads of the escapes, however, can allow for smaller capture pad dimensions to be used. For example, an alignment accuracy of less than 14 microns, e.g., an alignment capability of 10 microns, may allow microstrip traces and strip line traces to be combined into a single escape routing layer. Thus, a total number of layers in package substrate 204 may be reduced.

Package substrate 204 may include an escape line routing layer 302 extending in a horizontal direction over a dielectric layer 304. More particularly, escape line routing layer 302 may include several conductive pads 306 electrically connected to respective conductive traces 308. That is, conductive traces 308 may extend from respective conductive pads 306 to carry electrical signals within a plane of escape line routing layer 302.

Conductive pads 306 may include a noncircular pad cross-section 310. More particularly, noncircular pad cross-section 310 may have a width dimension that differs from a length dimension. For example, noncircular pad cross-section 310 may be a rectangular cross-section. Alternatively, noncircular pad cross-section 310 may have any other noncircular shape, including an elliptical or a polygonal profile.

In an embodiment, package substrate 204 includes conductive pillars 312 (indicated by hidden lines underneath conductive pad 306) extending vertically through dielectric layer 304. More particularly, conductive pads 306 within escape line routing layer 302 may be electrically connected to respective conductive pillars 312 extending vertically away from escape line routing layer 302. As described below, conductive pads 306 may be formed using a semi-additive process, and noncircular pad cross-sections 310 may be achieved using such processes. Furthermore, conductive pillars 312 may be formed using the same semi-additive process, and thus, alignment between conductive pads 306 and conductive pillars 312 may be maintained in a range of 10 microns or less because several different processes are not required.

The noncircular shape of conductive pads 306 may allow for conductive pads 306 to be arranged in a manner that provides sufficient space to route both strip line escapes 314 and microstrip escapes 316 in the single escape line routing layer 302. In an embodiment, one or more conductive pads 306 of strip line escape 314 may be arranged in a first series 318. That is, conductive pads 306 of strip line escape 314 may come one after another in spatial succession. The series of conductive pads 306 may be in a sequence extending in an axial direction 320 or a lateral direction 322. Here, lateral direction 322 is used to define any direction orthogonal or not parallel with axial direction 320. For example, first series 318 may extend diagonally relative to axial direction 320.

One or more conductive pads 306 of microstrip escape 316 may be arranged in a second series 326. That is, conductive pads 306 of microstrip escape 316 may come one after another in spatial succession, and the sequence may be in axial direction 320 or lateral direction 322.

It is not necessary for conductive pads 306 of strip line escape 314 and microstrip escape 316 to be arranged in different series. More particularly, conductive pads 306 of any escape line may be combined into a same series. For example, conductive pads 306 of both strip line escape 314 and microstrip escape 316 may be arranged in first series 318 and/or second series 326. In any case, conductive pads 306 of all escape lines may be combined into the single escape line routing layer 302.

The noncircular cross-section of conductive pads 306 may allow for higher line density in escape line routing layer 302. More particularly, when conductive pads 306 and/or conductive pillars 312 are formed having noncircular cross-sections and arranged in a manner to form a gap 328 between conductive pads 306, a greater number of conductive traces 308 may be routed through gap 328 to expand the escape line routing from the smaller area to the larger area of package substrate 204.

Conductive pads 306 of first series 318 may be laterally separated from conductive pads 306 of second series 326 by gap 328. Here, lateral separation is intended to refer to a separation along the plane of escape line routing layer 302, and not necessarily a separation in lateral direction 322. For example, first series 318 and second series 326 may be arranged in parallel in a lateral direction 322, in which case, conductive pads 306 of respective series would be laterally separated in axial direction 320. In an embodiment, conductive pads 306 of first series 318 are arranged in a first direction and conductive pads 306 of second series 326 are arranged in a second direction parallel to the first direction. Thus, gap 328 may provide a routing space between the series, and the routing space may run in the same direction as the first direction and the second direction. Accordingly, conductive traces 308 extending from respective conductive pads 306 of first series 318 and second series 326 may extend through gap 328 in the same direction as the series of conductive pads 306, e.g., in axial direction 320. For example, conductive traces 308 may be routed through the space between several series of pads over a length greater than several width or length dimensions of the sequentially arranged pads.

Figure 4:
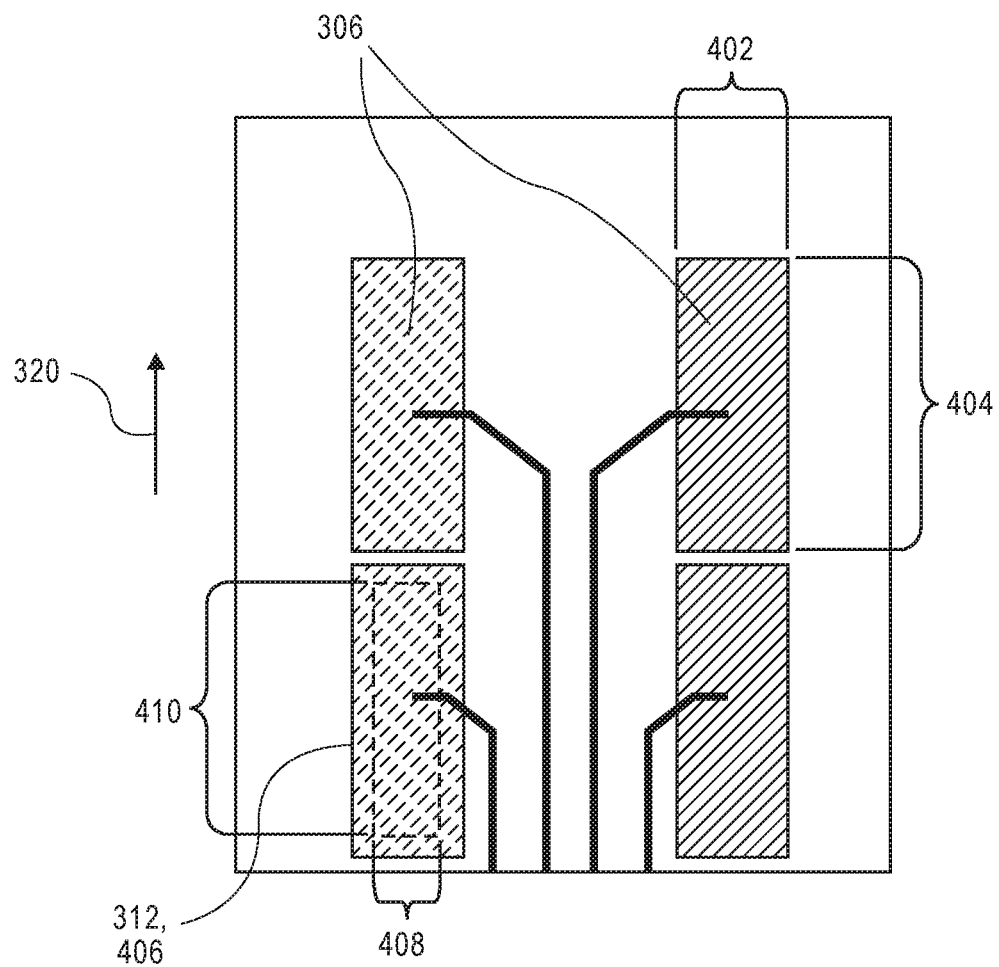
FIG. 4 is a detail view, taken from Detail A of FIG. 3, of an escape line routing layer having conductive pads arranged in several series, in accordance with an embodiment.

Referring to FIG. 4, a detail view, taken from Detail A of FIG. 3, of an escape line routing layer having conductive pads arranged in several series is illustrated in accordance with an embodiment. In an embodiment, a pad width dimension 402 of conductive pads 306 arranged in parallel series may be orthogonal to axial direction 320. More particularly, a pad length dimension 404 of conductive pads 306 may be in the same direction as the sequence of conductive pads 306. The pad length dimension 404 of noncircular pad cross-section 310 may be at least twice, e.g., three times, the pad width dimension 402 of noncircular pad cross-section 310. For example, conductive pads 306 may have a noncircular profile having pad width dimension 402 different than pad length dimension 404. By way of example, the rectangular pad cross-sections illustrated in FIG. 4 may have a pad width dimension 402 less than 20 microns, e.g., 16 microns, and a pad length dimension 404 greater than 60 microns, e.g., 79 microns.

Still referring to FIG. 4, package substrate 204 may include conductive pillars 312 having noncircular pillar cross-sections 406 (indicated by hidden lines). The noncircular profile of conductive pillars 312 may be the same as the noncircular profile of conductive pads 306. For example, when conductive pad 306 includes a rectangular profile, conductive pillar 312 may include a rectangular profile, as shown. Alternatively, the noncircular profile of conductive pillars 312 may be different than the noncircular profile of conductive pads 306. For example, when conductive pad 306 includes a rectangular profile, conductive pillar 312 may include an elliptical profile. Similarly, conductive pillar 312 may include a pillar width dimension 408 and a pillar length dimension 410, and the dimensions may be different, e.g., smaller, than pad width dimension 402 and pad length dimension 404. By way of example, a pad dimension may be twice an alignment capability plus a pillar dimension. For example, in a case of a 5 micron misalignment between the pad and pillar, and when a pillar width dimension 408 is 10 microns, a pad width dimension 402 may be 20 microns. In an embodiment, the rectangular pillar cross-section illustrated in FIG. 4 may have a width dimension less than 20 microns, e.g., 16 microns, and a length dimension greater than 60 microns, e.g., 79 microns. Thus, pillar width dimension 408 may be different than pillar length dimension 410, e.g., noncircular pillar cross-section 406 may be a rectangular cross-section.

Figure 5:
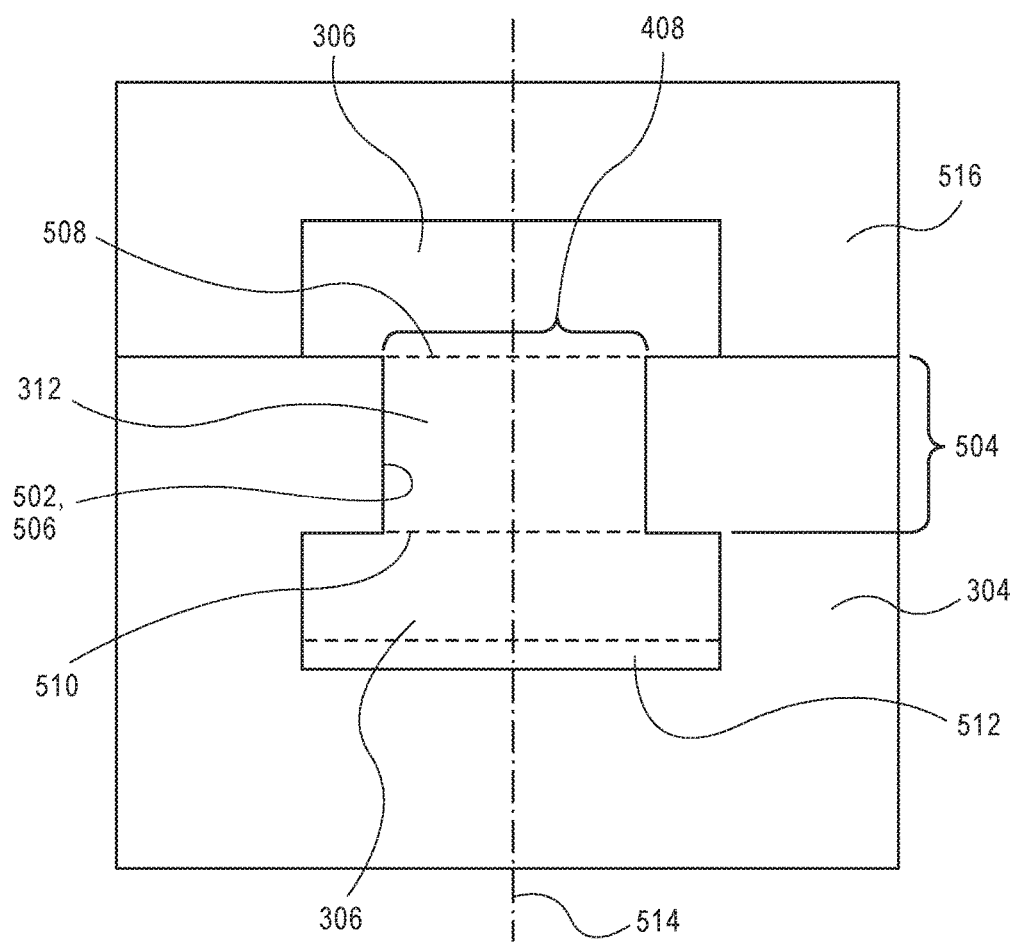
FIG. 5 is a sectional view, taken about line B-B of FIG. 3, of a conductive pillar having a noncircular cross-section electrically connected to an escape line routing layer of a package substrate, in accordance with an embodiment.

Referring to FIG. 5, a sectional view, taken about line B-B of FIG. 3, of a conductive pillar having a non-circular cross-section electrically connected to an escape line routing layer of a package substrate is illustrated in accordance with an embodiment. Typically, laser drilling to form a microvia as described above with respect to FIG. 1 results in a tapered microvia structure. For example, a laser drilled hole, and thus a microvia filling the hole, may include a top diameter of 49 microns at one side of a dielectric layer tapering to a bottom diameter of 35 microns at another side of the dielectric layer. Thus, a laser drilled hole may have a 15 micron taper based on diameter. By contrast, the two-operation lithography and plating process described below for forming conductive pads 306 and conductive pillars 312 having noncircular cross-sections may result in no or minimal taper of the conductive elements.

In an embodiment, conductive pillars 312 include respective sidewalls 502 having a height 504 through dielectric layer 304 of package substrate 204. Sidewall 502 may be absolutely or nearly vertical. For example, a taper 506 of sidewall 502 may be less than 5 microns over height 504, based on a difference in pillar dimension at a first end 508 and a second end 510 of conductive pillar 312. By way of example, conductive pillar 312 may include a nominal width dimension of 16 microns, and pillar width dimension 408 may vary by less than five microns over height 504. Experimental results have indicated that conductive pillar 312 formed using the processes described below may have pillar width dimension 408 of 15.5 microns at first end 508 and 16.0 microns at second end 510, i.e., taper 506 may be 0.5 micron.

Still referring to FIG. 5, axial alignment between conductive pillar 312 and conductive pads 306 above or below conductive pillar 312 may be in a range less than 10 microns, e.g., 6 microns. For example, a central axis 514 running through a geometric center of conductive pad 306 formed on a seed layer 512 may be within 10 microns of a central axis 514 running through a geometric center of conductive pillar 312 formed over such conductive pad 306. Similarly, a central axis 514 running through a geometric center of conductive pad 306 formed over dielectric layer 304, e.g., coplanar with a second dielectric layer 516, may be within 10 microns of a central axis 514 running through a geometric center of conductive pillar 312 formed under such conductive pad 306. Accordingly, conductive pads 306 and conductive pillar 312 of an escape routing may be well-aligned, allowing for smaller conductive pads 306 and conductive pillars 312 to be used such that escape routing may be incorporated in a single escape routing layer.

Figure 6:
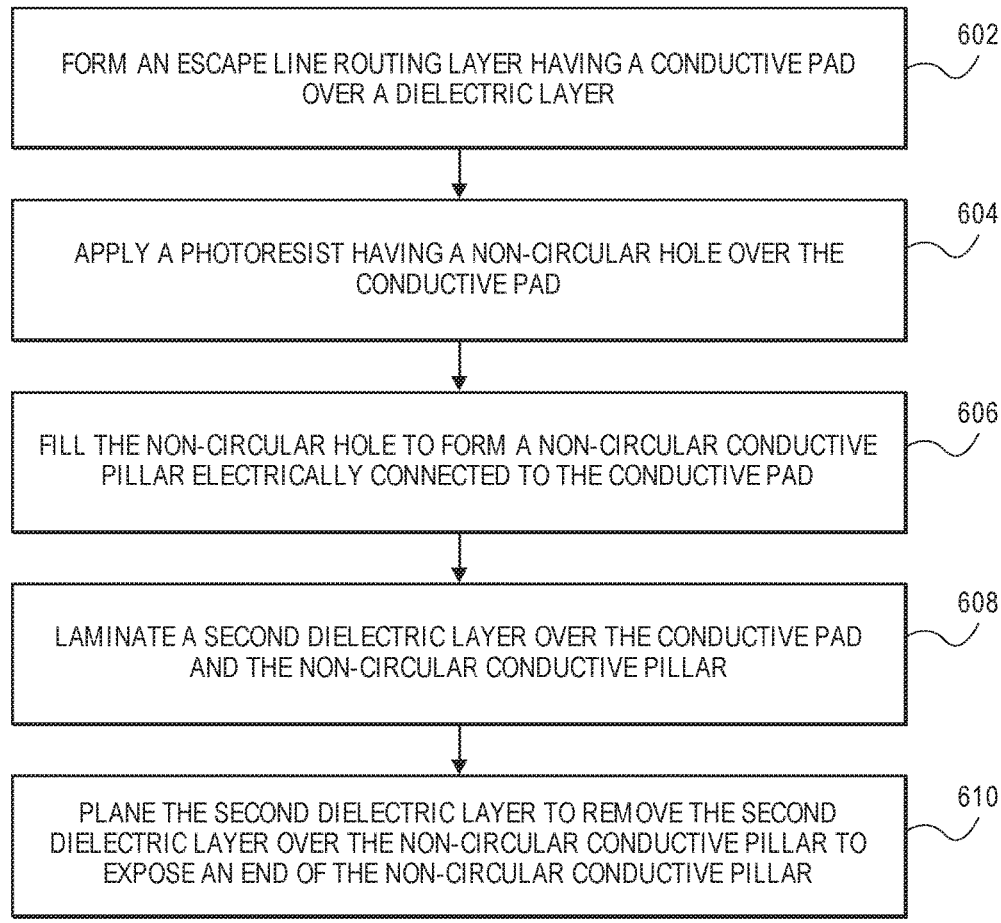
FIG. 6 is a flowchart of a method of fabricating a package substrate including conductive pillars having noncircular cross-sections, in accordance with an embodiment.

Referring to FIG. 6, a flowchart of a method of fabricating a package substrate is illustrated in accordance with an embodiment. The method may include a two-operation lithography and plating process to form conductive pads 306 and conductive pillars 312 having noncircular cross-sections. Furthermore, the method may be performed without using laser drilling to form holes for microvias. Thus, unlike current substrate architectures, vertical interconnects may include noncircular cross-sections and may be well-aligned with adjacent capture pads. FIGS. 7A-7I illustrate sectional views of several operations of the method of fabricating the package substrate having noncircular conductive pillars and/or pads. Accordingly, FIGS. 6 and 7A-7I are referred to intermittently in the following description of the method.

Figure 7A:
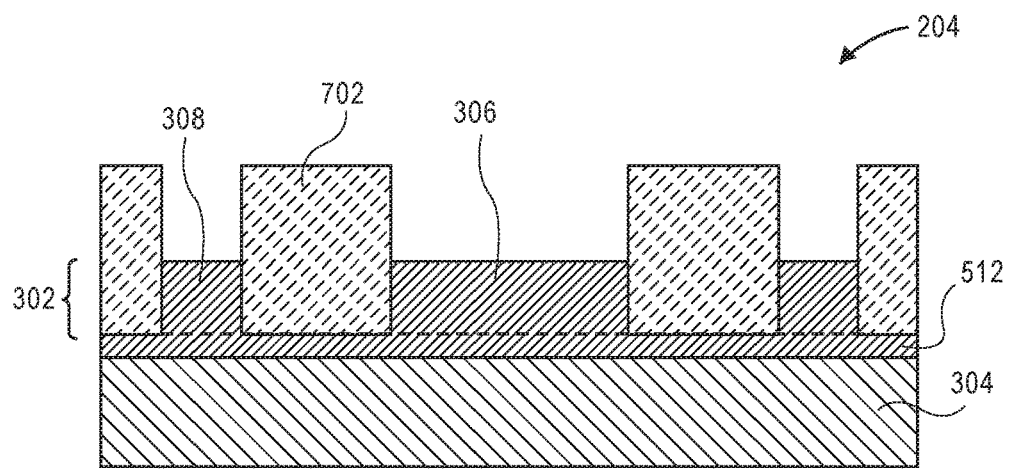
FIGS. 7A-7I are sectional views of several operations of a method of fabricating a package substrate including conductive pillars having noncircular cross-sections, in accordance with an embodiment.

At operation 602, escape line routing layer 302 may be formed on conductive seed layer 512. Referring to FIG. 7A, seed layer 512 may be located over dielectric layer 304 of package substrate 204. For example, seed layer 512 may include a layer of copper deposited on a base layer of dielectric material. Copper may be deposited in an electrolytic copper plating process. Escape line routing layer 302 may include conductive pad 306 formed over seed layer 512 using a first lithography operation. For example, a photoresist 702, such as a dry film resist, may be patterned on seed layer 512, and copper may be deposited into photoresist 702 spaces to form conductive pad 306 and/or conductive traces 308. The photoresist 702 spaces may have non-circular profiles such that conductive pad 306 is formed having noncircular pad cross-section 310.

Figure 7B:
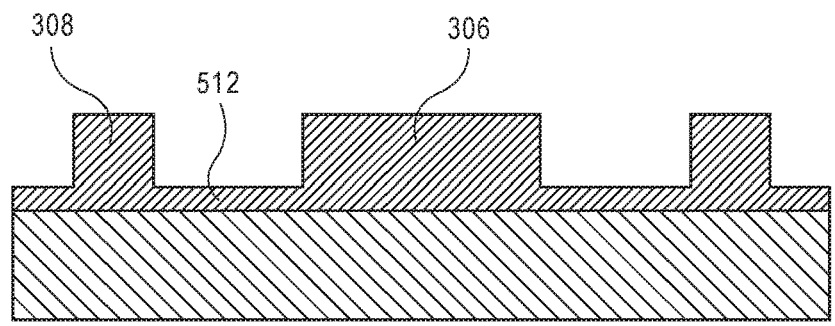

Referring to FIG. 7B, photoresist 702 may be stripped or removed during the semi additive process to expose the upper surfaces of seed layer 512, conductive pad 306, or conductive traces 308.

Figure 7C:
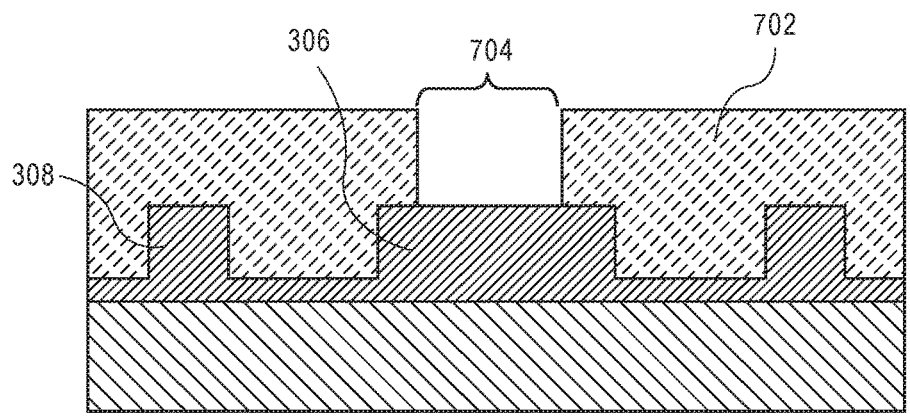

At operation 604, unlike a typical semi additive process in which seed layer 512 is flash etched, photoresist 702 may be applied over conductive pad 306 and conductive traces 308 of the lower escape line routing layer 302. Referring to FIG. 7C, photoresist 702 may be laminated such that a hole 704 remains in photoresist 702 over conductive pad 306. Hole 704 may be a space opened through photoresist 702 by an exposure of the photoresist layer. In an embodiment, hole 704 includes a noncircular cross-section, i.e., hole 704 includes a same cross-section as conductive pillar 312 that is to be formed over conductive pad 306. As described above, noncircular pillar cross-section 406 may be the same as or different than noncircular pad cross-section 310, and thus, hole 704 may have a profile that is the same as or different than a profile of the underlying conductive pad 306. Accordingly, the exposure and development stages of the second dry film resist lamination may determine a shape and dimension of the eventual conductive pillar 312.

Figure 7D:
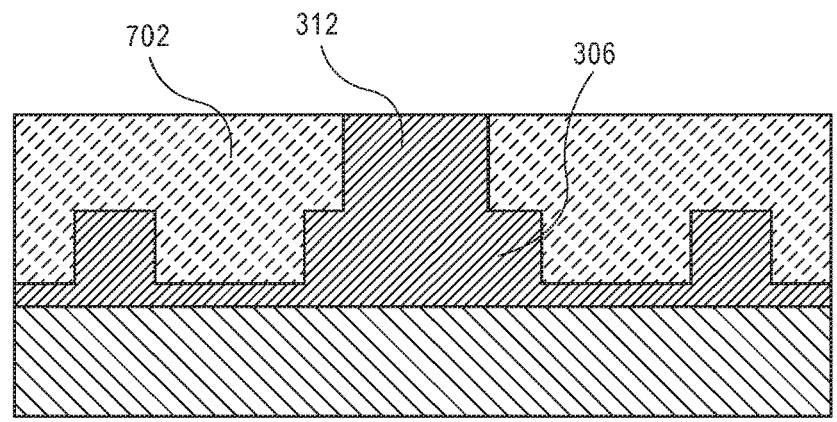

At operation 606, the noncircular hole 704 may be filled to form conductive pillar 312 having a noncircular cross-section. Referring to FIG. 7D, copper may be electrolytically plated in hole 704 to form copper pillar 312 electrically connected to conductive pad 306. Conductive pillar 312 may have an outer profile identical to an inner profile of hole 704. Thus, conductive pillar 312 may include noncircular pillar cross-section 406 and taper 506 characteristics as described above.

Figure 7E:
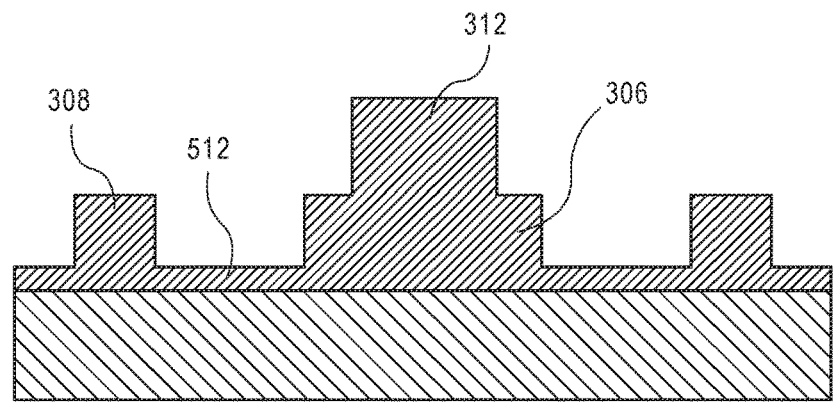
Figure 7F:
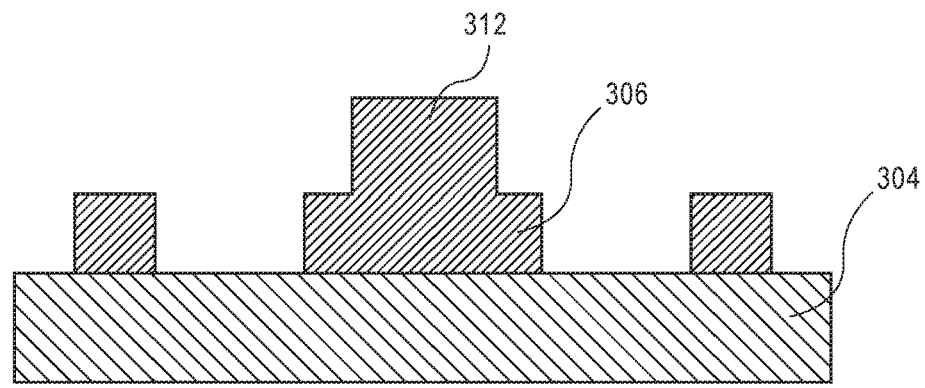

Referring to FIG. 7E, photoresist 702 may be stripped or removed during the semi additive process to expose the upper surfaces of seed layer 512, conductive pad 306, conductive pillar 312, and conductive traces 308. Referring to FIG. 7F, the conductive seed layer 512 may be etched to expose dielectric layer 304 around conductive pad 306 and conductive pillar 312. For example, conductive seed layer 512 may be removed using a flash etch chemistry. The built-up structure may be exposed to a wet chemistry process to remove seed layer 512 entirely without removing conductive pillar 312, conductive pad 306, or conductive trace 308 entirely. Thus, after performing the photolithography and plating operations described above, package substrate 204 may include well-aligned conductive pillar 312 and conductive pad 306 above dielectric layer 304. Given that conductive pillar 312 and conductive pad 306 of package substrate 204 may be formed using lithography, the dimensions of the pillar and pad may be limited only by a resolution and alignment of photoresist 702. Furthermore, the shape or profile of the pillar and pad may be limited only by the patterning of photoresist 702. Accordingly, high density routing may be achieved using noncircular pillar and pad geometries as described above. As a result, a cost reduction may be realized through the reduction in substrate layer count, as well as the elimination of laser drilling and desmear operations inherent in conventional circular-pattern pillar geometries. If necessary, after the flash etch process, typical dielectric to copper adhesion promotion, e.g., CZ, may be applied.

Figure 7G:
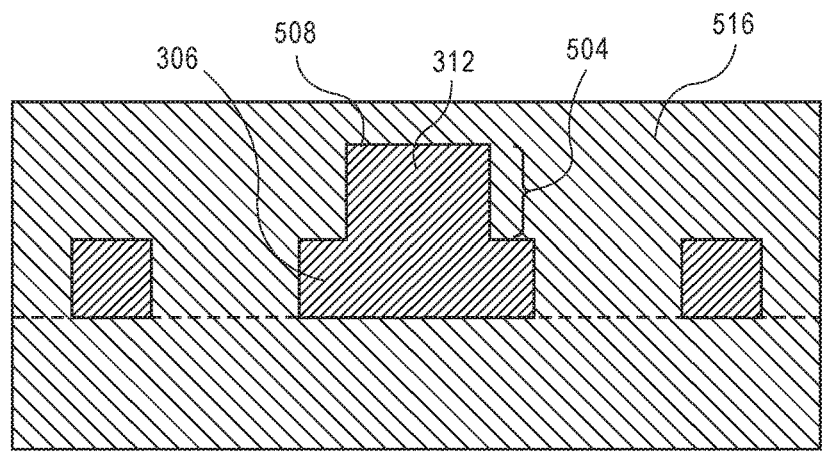

At operation 608, second dielectric layer 516 may be laminated over conductive pad 306 and conductive pillar 312. Referring to FIG. 7G, buildup dielectric is laminated on top of the pillar structure after an adhesion promoter is applied to the copper features. In an embodiment, second dielectric layer 516 is built up thicker than dielectric layer 304 to accommodate height 504 of conductive pillar 312. More particularly, second dielectric may be laminated over first end 508 of conductive pillar 312. Accordingly, a planarization operation may be used to remove second dielectric layer 516 to expose the top surface of conductive pillar 312.

Figure 7H:
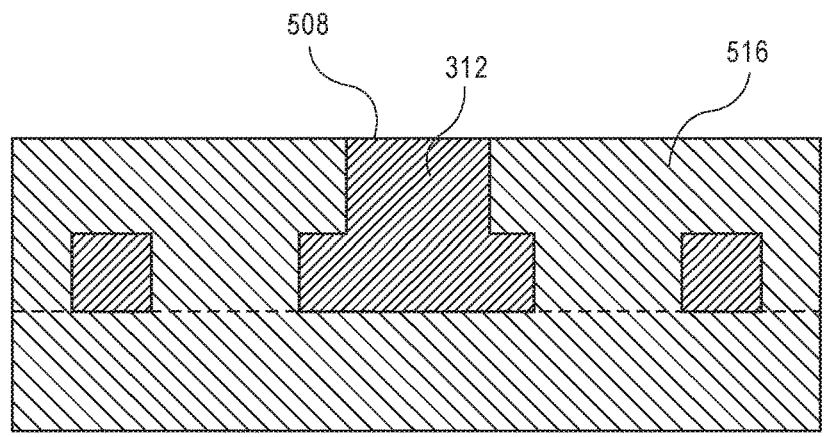

At operation 610, planarization may be used to remove second dielectric layer 516 over conductive pillar 312. Planing the second dielectric layer 516 may be a mechanical process, e.g., grinding, and/or a chemical process, e.g., an etching process. Accordingly, planing may include a coarse mechanical polishing operation, a fine plasma or chemical etching operation, etc. Referring to FIG. 7H, after removing a portion of second dielectric layer 516 over conductive pillar 312, noncircular pillar cross-section 406 may be exposed at first end 508. That is, a top surface of second dielectric layer 516 may be flush with a top surface of conductive pillar 312.

Figure 7I:
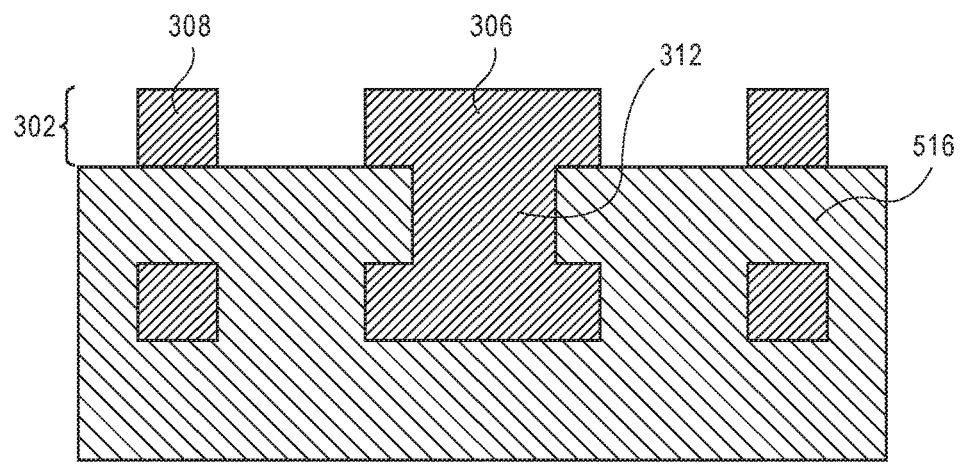

Referring to FIG. 7I, a second escape line routing layer 302 may be formed above second dielectric layer 516 and conductive pillar 312. For example, conductive pads 306 and/or conductive traces 308 may be deposited using the photolithography and plating operations described above. When electroless copper is a desired copper seed layer for the second escape line routing layer 302, a desmear process may be used to roughen the buildup surface. The desmear operation, however, may be used to improve mechanical adhesion in the process rather than to clean microvias vis-à-vis conventional package substrate processing. By contrast, when the copper seed layer is to be deposited by sputtering, the desmear operation may be omitted for a further cost reduction opportunity. The two-operation photolithography and plating process described above can be repeated for each escape line routing layer 302 of package substrate 204.

Figure 8:
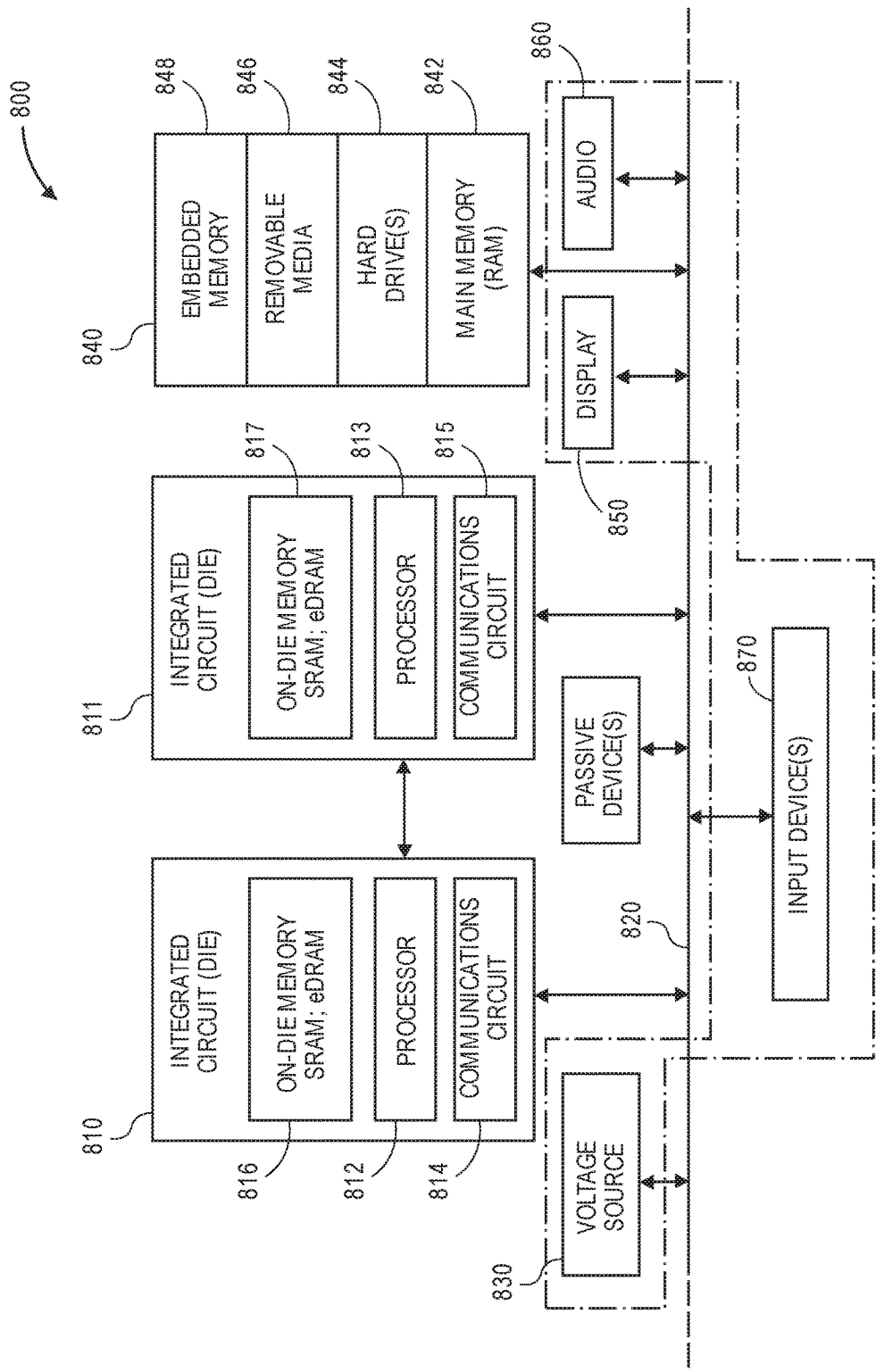
FIG. 8 is a schematic of a computer system, in accordance with an embodiment.

Referring to FIG. 8, a schematic of a computer system is illustrated in accordance with an embodiment. The computer system 800 (also referred to as the electronic system 800) as depicted can embody a package substrate including conductive pillars and/or pads having noncircular cross-sections, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a package substrate including conductive pillars and/or pads having noncircular cross-sections, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including having a package substrate incorporating conductive pillars and/or pads having noncircular cross-sections, according to any of the several disclosed embodiments and their equivalents, an electronic system, a computer system, one or more methods of fabricating an integrated circuit, and one or more methods of fabricating an electronic assembly that includes a package substrate incorporating conductive pillars and/or pads having noncircular cross-sections, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates incorporating conductive pillars and/or pads having noncircular cross-sections embodiments and their equivalents. A foundation substrate may be included, as represented by the dashed line of FIG. 8. Passive devices may also be included, as is also depicted in FIG. 8.

Embodiments of package substrates including conductive interconnects having noncircular cross-sections, and integrated circuit packages incorporating such package substrates, are described above. In an embodiment, a package substrate includes a dielectric layer, several conductive pillars extending through the dielectric layer, and an escape line routing layer over the dielectric layer. The escape line routing layer has several conductive pads electrically connected to respective conductive pillars. The conductive pillars include a noncircular pillar cross-section.

In one embodiment, the noncircular pillar cross-section includes a pillar width dimension and a pillar length dimension. The pillar width dimension is different than the pillar length dimension.

In one embodiment, the noncircular pillar cross-section is a rectangular cross-section.

In one embodiment, the conductive pillars include respective sidewalls having a height through the dielectric layer. The sidewalls include respective tapers of less than 5 microns over the height.

In one embodiment, the conductive pads include a noncircular pad cross-section. The conductive pads are arranged in a first series in an axial direction and in a second series in the axial direction. The conductive pads of the first series are laterally separated from the conductive pads of the second series by a gap.

In one embodiment, the noncircular pad cross-section is a rectangular cross-section having a pad width dimension and a pad length dimension.

In one embodiment, the pad length dimension is at least twice the pad width dimension.

In one embodiment, the escape line routing layer includes several conductive traces extending from respective conductive pads of the first series and the second series. The conductive traces extend through the gap in the axial direction.

In an embodiment, an integrated circuit package includes a package substrate and an integrated circuit. The package substrate includes a dielectric layer, several conductive pillars extending through the dielectric layer, and an escape line routing layer over the dielectric layer. The escape line routing layer has several conductive pads electrically connected to respective conductive pillars. The conductive pillars include a noncircular pillar cross-section. The integrated circuit is mounted on the package substrate and has several pins electrically connected to the conductive pillars.

In one embodiment, the noncircular pillar cross-section has a pillar width dimension and a pillar length dimension. The pillar width dimension is different than the pillar length dimension.

In one embodiment, the noncircular pillar cross-section is a rectangular cross-section.

In one embodiment, the conductive pillars include respective sidewalls having a height through the dielectric layer. The sidewalls include respective tapers of less than 5 microns over the height.

In one embodiment, the conductive pads include a noncircular pad cross-section. The conductive pads are arranged in a first series in an axial direction and in a second series in the axial direction. The conductive pads of the first series are laterally separated from the conductive pads of the second series by a gap.

In one embodiment, the noncircular pad cross-section is a rectangular cross-section.

In one embodiment, the escape line routing layer includes several conductive traces extending from respective conductive pads of the first series and the second series. The conductive traces extend through the gap in the axial direction.

In an embodiment, a method of fabricating a package substrate including conductive pillars having noncircular cross-sections includes forming an escape line routing layer on a conductive seed layer. The conductive seed layer is over a dielectric layer of a package substrate. The escape line routing layer includes a conductive pad. The method further includes applying a photoresist over the conductive pad. The photoresist includes a hole having a noncircular cross-section over the conductive pad. The method further includes filling the hole to form a conductive pillar having the noncircular cross-section. The conductive pillar is electrically connected to the conductive pad.

In one embodiment, the method further includes removing the photoresist. The method further includes etching the conductive seed layer to expose the dielectric layer around the conductive pad and the conductive pillar.

In one embodiment, the method further includes laminating a second dielectric layer over the conductive pad and the conductive pillar. The method further includes planing the second dielectric layer to remove the second dielectric layer over the conductive pillar to expose an end of the conductive pillar. The end has the noncircular cross-section.

In one embodiment, the noncircular cross-section is a rectangular cross-section.

In one embodiment, the conductive pillar includes a sidewall having a height through the second dielectric layer. The sidewall includes a taper of less than 5 microns over the height.

What is claimed is:

1. A package substrate, comprising:
   a dielectric layer;
   a plurality of conductive pillars extending through the dielectric layer, wherein the conductive pillars include a noncircular pillar cross-section, wherein the conductive pillars include respective sidewalls having a height through the dielectric layer, and wherein the sidewalls include respective tapers of less than 5 microns over the height; and
   an escape line routing layer over the dielectric layer, the escape line routing layer having a plurality of conductive pads electrically connected to respective conductive pillars, wherein an axial alignment between the conductive pillars and their respective conductive pads is 10 microns or less.

2. The package substrate of claim 1, wherein the noncircular pillar cross-section includes a pillar width dimension and a pillar length dimension, and wherein the pillar width dimension is different than the pillar length dimension.

3. The package substrate of claim 2, wherein the noncircular pillar cross-section is a rectangular cross-section.

4. The package substrate of claim 1, wherein the conductive pads include a noncircular pad cross-section, wherein the conductive pads are arranged in a first series in an axial direction and in a second series in the axial direction, and wherein the conductive pads of the first series are laterally separated from the conductive pads of the second series by a gap.

5. The package substrate of claim 4, wherein the noncircular pad cross-section is a rectangular cross-section having a pad width dimension and a pad length dimension.

6. The package substrate of claim 5, wherein the pad length dimension is at least twice the pad width dimension.

7. The package substrate of claim 4, wherein the escape line routing layer includes a plurality of conductive traces extending from respective conductive pads of the first series and the second series, and wherein the conductive traces extend through the gap in the axial direction.

8. An integrated circuit package, comprising:
   a package substrate including
      a dielectric layer,
      a plurality of conductive pillars extending through the dielectric layer, wherein the conductive pillars include a noncircular pillar cross-section, wherein the conductive pillars include respective sidewalls having a height through the dielectric layer, and wherein the sidewalls include respective tapers of less than 5 microns over the height, and
      an escape line routing layer over the dielectric layer, the escape line routing layer having a plurality of conductive pads electrically connected to respective conductive pillars, wherein an axial alignment between the conductive pillars and their respective conductive pads is 10 microns or less; and
   an integrated circuit mounted on the package substrate and having a plurality of pins electrically connected to the conductive pillars.

9. The integrated circuit package of claim 8, wherein the noncircular pillar cross-section has a pillar width dimension and a pillar length dimension, and wherein the pillar width dimension is different than the pillar length dimension.

10. The integrated circuit package of claim 9, wherein the noncircular pillar cross-section is a rectangular cross-section.

11. The integrated circuit package of claim 8, wherein the conductive pads include a noncircular pad cross-section, wherein the conductive pads are arranged in a first series in an axial direction and in a second series in the axial direction, and wherein the conductive pads of the first series are laterally separated from the conductive pads of the second series by a gap.

12. The integrated circuit package of claim 11, wherein the noncircular pad cross-section is a rectangular cross-section.

13. The integrated circuit package of claim 11, wherein the escape line routing layer includes a plurality of conductive traces extending from respective conductive pads of the first series and the second series, and wherein the conductive traces extend through the gap in the axial direction.

\* \* \* \* \*